(12) United States Patent
Yeh et al.

(10) Patent No.: US 9,819,152 B2
(45) Date of Patent: Nov. 14, 2017

(54) METHOD TO FABRICATE GAN-BASED VERTICAL-CAVITY SURFACE-EMITTING DEVICES FEATURING SILICON-DIFFUSION DEFINED CURRENT BLOCKING LAYER

(71) Applicants: Ping-Hui Yeh, Taipei (TW);
Meng-Chun Yu, Taipei (TW);
Jia-Huan LIn, Taipei (TW);
Ching-Chin Huang, Taipei (TW)

(72) Inventors: Ping-Hui Yeh, Taipei (TW);
Meng-Chun Yu, Taipei (TW);
Jia-Huan LIn, Taipei (TW);
Ching-Chin Huang, Taipei (TW)

(73) Assignee: NATIONAL TAIWAN UNIVERSITY OF SCIENCE AND TECHNOLOGY, Taipei (TW)

( * ) Notice: Subject to any disclaimer, the term of this patent is extended or adjusted under 35 U.S.C. 154(b) by 132 days.

(21) Appl. No.: 14/876,817

(22) Filed: Oct. 7, 2015

(65) Prior Publication Data

US 2017/0104315 A1    Apr. 13, 2017

(51) Int. Cl.
| | |
|---|---|
| *H01S 5/183* | (2006.01) |
| *H01L 33/00* | (2010.01) |
| *H01L 33/06* | (2010.01) |
| *H01L 33/10* | (2010.01) |
| *H01L 33/14* | (2010.01) |
| *H01L 33/32* | (2010.01) |
| *H01L 33/46* | (2010.01) |
| *H01S 5/343* | (2006.01) |

(52) U.S. Cl.
CPC ...... *H01S 5/18308* (2013.01); *H01L 33/0045* (2013.01); *H01L 33/0075* (2013.01); *H01L 33/06* (2013.01); *H01L 33/105* (2013.01); *H01L 33/145* (2013.01); *H01L 33/32* (2013.01); *H01L 33/465* (2013.01); *H01S 5/183* (2013.01); *H01S 5/34333* (2013.01)

(58) Field of Classification Search
CPC combination set(s) only.
See application file for complete search history.

(56) References Cited

U.S. PATENT DOCUMENTS

| | | | |
|---|---|---|---|
| 2007/0195843 A1* | 8/2007 | Tamura | B82Y 20/00 372/45.01 |
| 2010/0265976 A1* | 10/2010 | Bousquet | H01L 21/02389 372/44.01 |
| 2013/0307008 A1* | 11/2013 | Chen | H01L 33/58 257/98 |

* cited by examiner

*Primary Examiner* — Kyoung Lee
*Assistant Examiner* — Ratisha Mehta

(57) ABSTRACT

This invention discloses a method for the fabrication of GaN-based vertical cavity surface-emitting devices featuring a silicon-diffusion defined current blocking layer (CBL). Such devices include vertical-cavity surface-emitting laser (VCSEL) and resonant-cavity light-emitting diode (RCLED). The silicon-diffused P-type GaN region can be converted into N-type GaN and thereby attaining a current blocking effect under reverse bias. And the surface of the silicon-diffused area is flat so the thickness of subsequent optical coating is uniform across the emitting aperture. Thus, this method effectively reduces the optical-mode field diameter of the device, significantly decreases the spectral width of LED, and produces single-mode emission of VCSEL.

7 Claims, 4 Drawing Sheets

METHOD TO FABRICATE GAN-BASED VERTICAL-CAVITY SURFACE-EMITTING DEVICES FEATURING SILICON-DIFFUSION DEFINED CURRENT BLOCKING LAYER

BACKGROUND OF THE INVENTION

1. Field of the Invention

The present invention relates to a method for the fabrication of GaN-based vertical cavity surface-emitting devices with current confinement structure, in particular, to a silicon-diffusion defined current confinement structure.

2. Description of Related Art

Semiconductor laser, due to its small size, high efficiency, high cost-performance, and low operating voltage, is suitable for fiber optic communication, high-density optical storage, high-speed laser printing, and biomedicine research, and has become one of important active photoelectric components.

Conventional semiconductor laser structure includes vertical cavity surface-emitting laser (VCSEL) and edge-emitting laser (EEL). In comparison, vertical cavity surface-emitting laser has more advantages than edge-emitting laser, including lower threshold current, symmetrical circular laser beam, smaller divergence angle, and easier to be made into a two-dimensional array, especially suitable for use in fiber-optic communications.

Traditional vertical cavity surface-emitting laser has different confinement structures, including etched air-post structure, buried heterostructure, ion implanted structure and oxide confined structure in four categories.

The wavelength of a vertical cavity surface-emitting laser may vary from infrared light to visible and ultraviolet light with different materials. Currently, the development of the VCSEL that uses GaAs (Gallium Arsenide) material to exhibit the near-infrared light wavelength in a range from 0.78 µm to 0.98 µm has been quite mature, and the VCSEL of long-wavelength light in a range from 1.3 µm to 1.55 µm that uses GaAsInP material is becoming mature rapidly. However, the development of the VCSEL that uses GaN (Gallium Nitride) material to exhibit the short-wavelength in a range from 0.36 µm to 0.55 µm has been relatively slow, largely because of the lack of lattice-matched GaN substrate material and of lattice-matched GaN-based high reflectance DBR (distributed Bragg reflector) epitaxial growth. Meanwhile, the gain of the active layer material itself is low, thus GaN vertical cavity surface-emitting laser requires a better current confinement structure to enhance carrier concentration, and good optical surface coating of high-reflectance and low-loss to reduce the laser threshold.

In the prior art, U.S. Pat. No. 5,226,053 disclosed the use of vertical resonant-cavity and distributed Bragg reflector, but it didn't teach a silicon-diffusion defined current confinement structure. Another prior art, U.S. Pat. No. 8,774,246 disclosed the use of depleted hetero junction current blocking region (DHCBR) as an instrument for current confinement. It is different from our design which uses diffusion-produced homo-junction to form a current blocking structure.

SUMMARY OF THE INVENTION

The primary object of the present invention is to provide GaN-based vertical-cavity surface-emitting devices having silicon-diffusion defined current blocking layer that furnishes a silicon diffusion region confining an aperture for current-passing, thus effectively reducing the diameter of the optical mode field that may lead to single-mode operation. Moreover, the surface of the aperture is maintained smooth during CBL fabrication for retaining good quality of optical coating. In result, single-mode VCSELs, and low spectral-width RCLEDs can be obtained.

Another object of the present invention is to provide a fabrication method to convert the P-type silicon-diffusion region into an N-type gallium nitride (GaN), rendering a current confinement structure that provides a light-emitting aperture and current-passing path for effective current concentration, increasing the gain, and reducing current threshold to achieve stimulated emission effect. The fabrication process of the silicon-diffusion defined current blocking layer of the present invention can produce a light-emitting aperture with a diameter as small as or less than 5 µm, which can effectively reduce the diameter of optical mode field and produce a single mode VCSEL.

Another object of the present invention is to fabricate a silicon-diffusion defined current blocking layer. Firstly, If the surface layer of the P-type gallium nitride has high concentration of holes, such as thin layer of indium gallium nitride, the surface layer of the silicon-diffusion region needs to be etched to remove about 5 nm to 20 nm in thickness of the surface, and if there is no high concentration of holes on the surface of the P-type gallium nitride, then this removal step is unnecessary, followed by coating a silicon thin film on the surface of the desired silicon diffusion region, heating the silicon thin film to diffuse the silicon into the P-type gallium nitride, converting the P-type gallium nitride into N-type gallium nitride, and the N-type gallium nitride region of the original P-type gallium nitride region becomes reverse biased while the P-type gallium nitride layer is forward biased, and the current flow can be effectively confined in the light-emitting aperture.

Another object of the present invention is to provide a silicon-diffusion defined three-dimensional current confining structure that differs with a conventional surface only confining structure of a GaN-based vertical-cavity surface-emitting device by extending the confining range to within the P-type gallium nitride layer. The confining region is determined by the diffusion time which is dependent on the thickness and hole concentration of the P-type gallium nitride layer, while the thickness or hole concentration increases or decreases the diffusion time will increase or decrease correspondingly to obtain an appropriate diffusion depth, and the diffusion depth is kept more than 30 nm away from the multi-quantum well layer of the device to avoid occurrence of current leakage paths. It is therefore highly effective to control the current flow not to expand further after flowing into the P-type GaN that otherwise may degrade current confining effect. Thus the three-dimensional current confining structure of the present invention facilitates gain concentration and reduces threshold current to attain the function of current confinement.

Another object of the present invention is to provide a method of fabrication for a GaN-based vertical-cavity surface-emitting device having a silicon-diffusion defined current blocking layer, wherein the silicon-diffusion region in the P-type gallium nitride layer of the device is formed as a hollow annular structure that encompasses an aperture of current flow path with an inner peripheral of the hollow annular structure, wherein the size of the aperture of current flow path is determined by the diameter of the hollow area of the hollow annular structure.

The above and other detail structure, applications, features and other advantages of the present invention will be

DETAILED DESCRIPTION OF THE PREFERRED EMBODIMENTS

Figure 1:
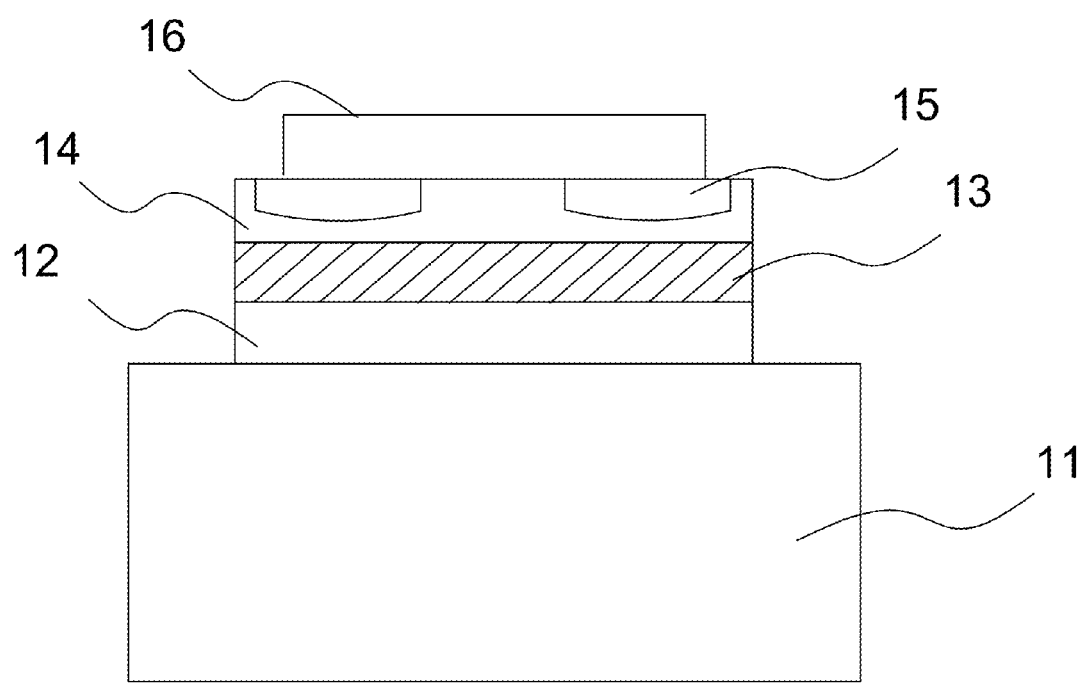
FIG. 1 is a basic diagram of a GaN-based light-emitting device with a silicon-diffusion defined current blocking layer of the present invention.

As shown in FIG. 1, the GaN-based light-emitting device with a silicon-diffusion defined current blocking layer is provided by the present invention, including a substrate 11, a N-type gallium nitride layer 12, an active layer region 13, a P-type gallium nitride layer 14 which may include a P-type gallium indium nitride thin film on the surface, a silicon-diffusion region 15, and a conductive layer 16, wherein the silicon-diffusion region 15 can invert the P-type gallium nitride (p-GaN) into a N-type gallium nitride (n-GaN) and produce a silicon-diffusion defined confinement structure having a current confinement region, wherein the current is concentrated to increase gain and reduce current threshold, thereby enhancing stimulated emission.

Figure 2:
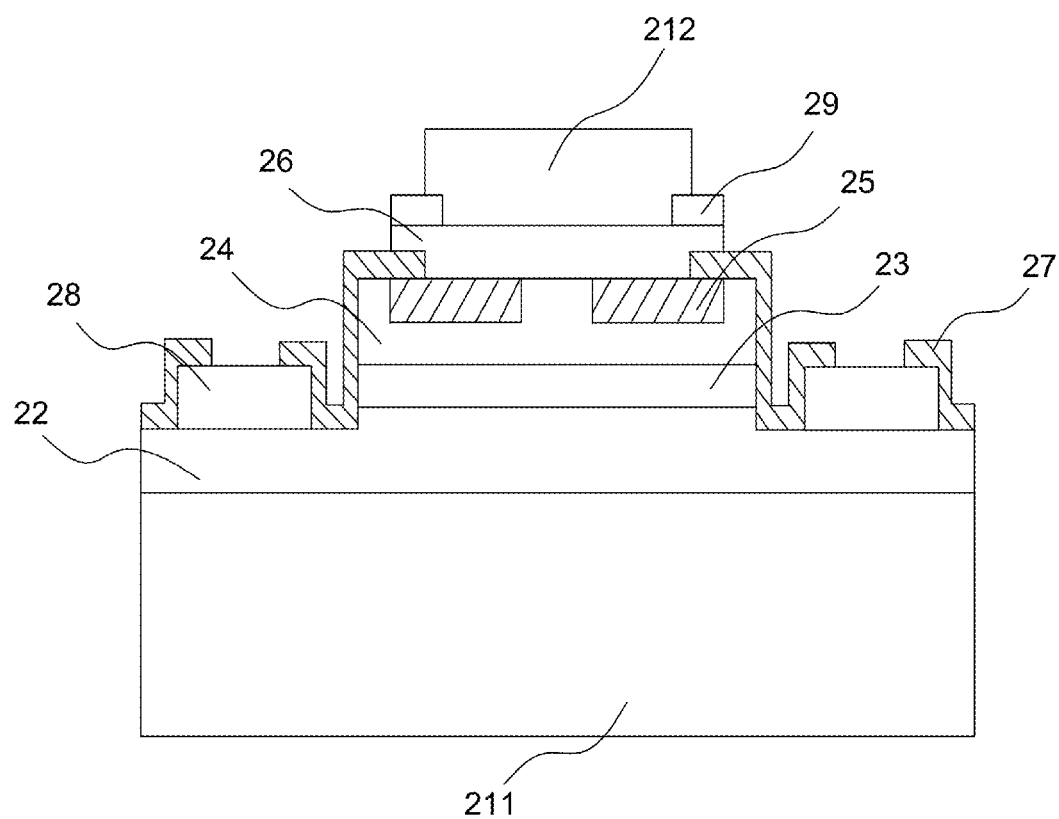
FIG. 2 is a schematic diagram of a GaN-based vertical-cavity surface-emitting device with a silicon-diffusion defined current blocking layer of the present invention in a horizontal configuration.

As shown in FIG. 2, a GaN-based vertical-cavity surface-emitting device with a silicon-diffused current confining structure of the present invention, wherein the current is effectively concentrated in light-emitting aperture through an appropriate silicon-diffusion depth at least 30 nm away from the multi-quantum well layer of the device to avoid occurrence of current leakage paths. The operational principle of the present invention includes steps of coating the silicon diffusion region 25 on the surface of the P-type gallium nitride layer 24, heating the wafer to diffuse the silicon into the P-type gallium nitride layer 24 to produce the silicon-diffusion region 25, converting P-type gallium nitride into a N-type gallium nitride, and the N-type gallium nitride of the original P-type gallium nitride layer 24 become reverse biased while the P-type gallium nitride layer 24 is forward biased and the current flow can be effectively confined in the light-emitting aperture.

The current confining structure provided by the present invention is not on the surface of the structure only, but is also extended to within the P-type gallium nitride layer 24 to effectively control the current flow so as not to expand further outwardly and consequently enlarge the active layer region 23 of the current confining structure after the current flowing into the P-type gallium nitride layer 24, preventing the degradation of current confining effect and hence reducing the current threshold.

FIG. 2 shows a preferred embodiment of the present invention, a GaN wafer used in the embodiment includes a P-type GaN layer 24, a multiple-quantum well active layer 23, a N-type GaN layer 22, an AlN/GaN (aluminum nitride/gallium nitride) epitaxial bottom DBR (distributed Bragg reflector) layer 211, and a U-type GaN on sapphire substrate 210. The present invention is also applicable for an epitaxial wafer without an epitaxial bottom DBR layer 211, for example, after completion of coating a dielectric top DBR, the substrate used for epitaxial growth is removed and polished, and followed by coating a dielectric bottom DBR on the bottom surface of the wafer.

The fabrication process for the wafer shown in FIG. 2 with an epitaxial bottom DBR layer is described hereinafter.

The P-type gallium nitride layer 24 is activated first at temperature about 725 degree C. for about 20 minutes, and metals such as titanium and gold are sequentially plated on the N-type gallium nitride layer 22 area, forming an ohmic contact N-type electrode 28. The current blocking layer structure is mainly to define a light-emitting aperture of a GaN-based vertical-cavity surface-emitting device of the present invention in order to attain a current confining effect. Photolithography technique is exploited to outline the shape of a silicon-diffusion region first in the fabrication process, including steps: placing the wafer into a ICP-RIE (inductively coupled plasma-reactive ion etcher) equipment for etching away about 5 nm to 20 nm thickness to remove the top thin film of high hole concentration on the surface of the P-type GaN layer 24, coating about 30-100 nm silicon thin film with an electron beam evaporator on the surface of the silicon diffusion region 25, and placing the wafer into a rapid thermal annealing furnace for heat treatment in a range from 750 to 850 degree C. with duration of 10 to 30 minutes, so that silicon can be effectively diffused downward into the P-type GaN layer 24, wherein the silicon-diffusion region 25 of the P-type GaN layer 24 that has been diffused with silicon will be converted into a N-type gallium nitride region, and followed by soaking the wafer in a buffered oxide etch solution for removing residual silicon left after diffusion on the surface to complete the fabrication process of the CBL structure of the present invention.

As shown in FIG. 2, a preferred embodiment of the present invention disclosed that the silicon-diffusion region 25 is of a hollow annular shape, and the inner edge of the central hollow annular shape circumscribes a current-passing aperture for light-emitting devices, furnishing a light-emitting aperture in the light-emitting region, wherein on top of the outer edge of the central hollow annular shape is superposed with the silicon dioxide insulating layer 29, wherein the diameter of the current-passing aperture of the light-emitting devices is determined by the diameter of the area of the central hollow annular shape of the silicon-diffusion region.

As shown in the FIG. 2, the silicon dioxide insulating layer 29 allows the P-type electrode 27 and P-type gallium nitride layer 24 to be separated, so that current can only flow through the transparent conductive layer 26 by passing through the light-emitting aperture area of the current blocking layer 25, effectively preventing the GaN-based vertical cavity surface-emitting device to be conductive and light-emitting outside the non-defined region.

As shown in FIG. 2, an indium tin oxide (ITO) is coated on the P-type gallium nitride layer 24 to produce the transparent conductive layer 26, and the P-type ohmic contact electrode 27 and the high reflectance dielectric DBR are provided, respectively, on top of the transparent conductive layer 26.

Figure 3:
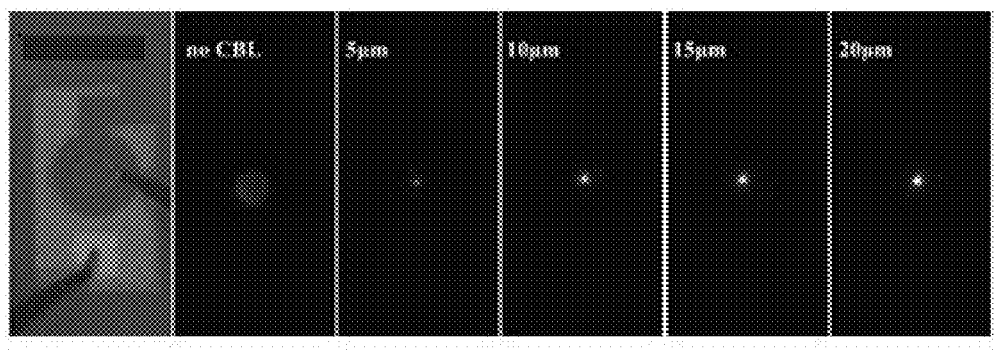
FIG. 3 is a CCD photograph showing various size of light-emitting aperture with current 10 mA, indicating that the size of light-emitting aperture equals to the silicon-diffusion defined aperture of the present invention.

As shown in FIG. 3, CCD photographs exhibit various size of light-emitting aperture under operation current 10 mA, from left to right, including: 1) a front view of the device being measured, 2) the light-emitting aperture diameter is 120 μm, and light-emitting region is a transparent conductive layer without silicon-diffusion region; and the light-emitting aperture with silicon-diffusion with various diameters, including 3) 5 μm, 4) 10 μm, 5) 15 μm, 6) 20 μm four types of silicon-diffusion defined light-emitting aperture, revealing that the size of light-emitting aperture equals to that of the silicon-diffusion defined aperture of the present invention.

As the aperture size of RCLED was incrementally reduced from 15 to 10 to 5 μm, the resonant cavity effect became more prominent and the corresponding spectral width, the full width at half maximum (FWHM) of the primary peak, decreased from 7.0 to 2.1 to 1.9 nm, respectively, at a current of 5 mA, compared with a FWHM of approximately 23 nm of a no-silicon-diffusion RCLED with the same DBR reflectance. And the minimum spectral widths of 10- and 5-μm devices at various current levels were 2.0 and 1.5 nm, respectively, indicating that RCLED of smaller aperture size has narrower optimum spectral width. Moreover, a single-mode GaN-based VCSEL has been produced with a silicon-diffusion-defined aperture of 3 μmin diameter. The threshold current was as low as approximately 0.5 mA, the spectral width was below 1 nm, and the divergence angle was approximately 6° corresponding to a beam waist full width of near 3 μm, indicating a single-mode operation. Thus, it is manifested that the silicon-diffusion defined current confining structure of the present invention has significant effect in reducing the spectral width of the light-emitting device and producing single-mode VCSEL.

Figure 4:
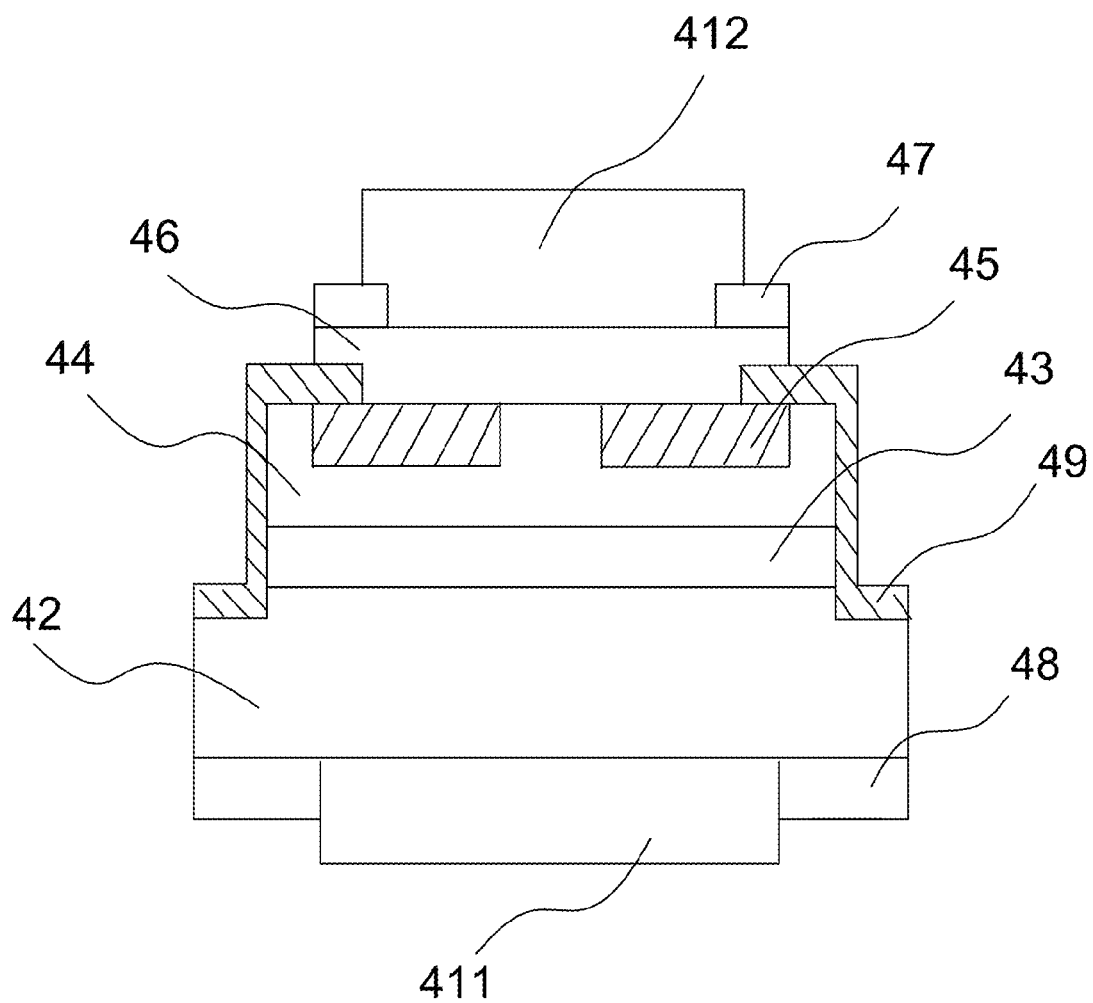
FIG. 4 is a schematic diagram of a GaN-based vertical-cavity surface-emitting device with a silicon-diffusion defined current blocking layer of the present invention in a vertical configuration.

As shown in FIG. 4, it illustrates a GaN-based vertical-cavity surface-emitting device with a silicon-diffusion defined current blocking layer of the present invention in a vertical configuration, including a bottom DBR layer 411, a top DBR layer 412, a N-type gallium nitride layer 42, a multiple-quantum well active layer 43, a P-type gallium nitride layer 44 which may include a P-type gallium indium nitride thin film on the surface, a silicon-diffusion region 45, and a transparent conductive layer 46, a P-type electrode 47, a N-type electrode 48, and a silicon dioxide insulating layer 49.

It is to be understood that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for the fabrication of GaN-based vertical cavity surface-emitting devices with a structure having a silicon-diffusion defined current blocking region, including a vertical-cavity surface-emitting laser and a resonant-cavity light emitting diode in a horizontal configuration, wherein the method exploits an epitaxial wafer including a P-type GaN layer, a multiple-quantum well active layer, and a N-type GaN layer, comprising steps:
    determining the pattern of a silicon-diffusion region with photolithography;
    etching away high concentration holes of the P-type gallium indium nitride thin film on the surface of the P-type GaN layer by placing the wafer in an inductively coupled plasma-reactive ion etcher;
    coating a silicon thin film on the pre-patterned surface of the P-type gallium nitride layer, and lifting off the silicon deposited on the non-diffusion areas;
    heating to diffuse the silicon of the silicon thin film downward into the P-type GaN layer in a rapid thermal annealing furnace, wherein the silicon-diffusion region of the P-type GaN layer that has been diffused with the silicon is converted into a N-type gallium nitride region forming a current confining region, wherein the silicon-diffusion region is of a hollow annular shape, and the inner edge of the central hollow annular shape circumscribes a current-passing aperture for light-emitting devices, furnishing a light-emitting aperture in the light-emitting region, wherein on top of the outer edge of the central hollow annular shape is superposed with a silicon nitride or oxide insulating layer, and
    soaking the wafer in buffered oxide etch solution for removing residual silicon left on the surface after diffusion to complete the fabrication process of the silicon-diffusion defined current blocking region.

2. The method for the fabrication of GaN-based vertical cavity surface-emitting devices with a structure having a silicon-diffusion defined current blocking region of claim 1, wherein the thickness of etching away high concentration holes of the P-type gallium indium nitride thin film on the surface of the P-type GaN layer is from 5 to 20 nm.

3. The method for the fabrication of GaN-based vertical cavity surface-emitting devices with a structure having a silicon-diffusion defined current blocking region of claim 1, wherein the silicon-diffusion region is of a hollow annular shape, and the inner edge of the central hollow annular shape circumscribes a current-passing aperture for light-emitting devices, wherein the size of the current-passing aperture of the light-emitting devices is determined by the size of the central hollow area surrounded by the silicon-diffusion region.

4. The method for the fabrication of GaN-based light-emitting devices with a structure having a silicon-diffusion defined current blocking region of claim 1, including edge-emitting laser and super luminescent diode, wherein the silicon-diffusion region circumscribing a current-passing area for light-emitting devices, wherein the size of the current-passing area of the light-emitting devices is determined by the size of the central hollow area surrounded by the silicon-diffusion region.

5. The method for the fabrication of GaN-based vertical cavity surface-emitting devices with a structure having a silicon-diffusion defined current blocking region of claim 1, wherein the coating surface is kept smooth to enhance optical coating quality, resonant effect, and reducing spectral width of light-emitting devices.

6. The method for the fabrication of GaN-based vertical cavity surface-emitting devices with a structure having a silicon-diffusion defined current blocking region of claim 1, wherein the silicon-diffusion defined current blocking region is determined by the diffusion time that depends on the thickness and hole concentration of the P-type gallium nitride layer, while the thickness or hole concentration increases or decreases the diffusion time will increase or decrease correspondingly in a range of 10 to 30 minutes to obtain an appropriate diffusion depth, wherein the depth of the silicon-diffusion is kept more than 30 nm away from the multi-quantum well layer of the GaN-based vertical cavity surface-emitting devices.

7. The method for the fabrication of GaN-based vertical cavity surface-emitting devices with a structure having a silicon-diffusion defined current blocking region of claim 1, wherein the fabrication of current blocking region uses an electron beam evaporator for coating a silicon thin film with thickness from 30 nm to 100 nm on the surface of the P-type gallium nitride layer, followed by heating the silicon of the silicon thin film to diffuse downward into the P-type GaN layer in a rapid thermal annealing furnace, wherein the heating temperature range is from 750 to 850 degree C. with duration of 10 to 30 minutes for controlling the depth of the silicon-diffusion.

* * * * *